United States Patent
Stewart et al.

(10) Patent No.: US 10,534,028 B2
(45) Date of Patent: *Jan. 14, 2020

(54) METHODOLOGY FOR CHARGING BATTERIES SAFELY

(71) Applicant: Tesla Motors, Inc., Palo Alto, CA (US)

(72) Inventors: Sarah G. Stewart, San Francisco, CA (US); Christopher Dangler, Chapel Hill, NC (US); Clay H. Kishiyama, San Mateo, CA (US); Weston A. Hermann, Palo Alto, CA (US); Scott I. Kohn, Menlo Park, CA (US); Kurt R. Kelty, Palo Alto, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/359,210

(22) Filed: Nov. 22, 2016

(65) Prior Publication Data

US 2017/0074918 A1 Mar. 16, 2017

Related U.S. Application Data

(60) Continuation of application No. 14/499,757, filed on Sep. 29, 2014, now Pat. No. 9,506,990, which is a
(Continued)

(51) Int. Cl.
*G01R 31/02* (2006.01)
*G01R 31/382* (2019.01)
(Continued)

(52) U.S. Cl.
CPC ....... *G01R 31/025* (2013.01); *G01R 31/3648* (2013.01); *G01R 31/382* (2019.01);
(Continued)

(58) Field of Classification Search
CPC .......................... G01R 31/3648; G01R 31/025
(Continued)

(56) References Cited

U.S. PATENT DOCUMENTS

| | | | | |
|---|---|---|---|---|
| 5,864,220 A | * | 1/1999 | Reipur | H01M 10/4257 |
| | | | | 320/134 |
| 7,923,967 B2 | * | 4/2011 | Hamaguchi | H02J 7/0047 |
| | | | | 320/116 |

(Continued)

*Primary Examiner* — Ricky Ngon
(74) *Attorney, Agent, or Firm* — Knobbe, Martens, Olson & Bear, LLP

(57) ABSTRACT

An apparatus and method for identifying a presence of a short circuit in a battery pack. A fault-detection apparatus for a charging system that rapidly charges a collection of interconnected lithium ion battery cells, the safety system includes a data-acquisition system for receiving a set of data parameters from the collection while the charging system is actively charging the collection; a monitoring system evaluating the set of data parameters to identify a set of anomalous conditions; and a controller comparing the set of anomalous conditions against a set of predetermined profiles indicative of an internal short in one or more cells of the collection, the controller establishing an internal-short state for the collection when the comparing has a predetermined relationship to the set of predetermined profiles.

21 Claims, 8 Drawing Sheets

Related U.S. Application Data division of application No. 12/970,838, filed on Dec. 16, 2010, now Pat. No. 8,866,444.

(60) Provisional application No. 61/352,659, filed on Jun. 8, 2010.

(51) Int. Cl.
    *G01R 31/396*      (2019.01)
    *H01M 10/0525*      (2010.01)
    *H01M 10/48*      (2006.01)
    *H02J 7/00*      (2006.01)
    *G01R 31/36*      (2019.01)

(52) U.S. Cl.
CPC ...... *G01R 31/396* (2019.01); *H01M 10/0525* (2013.01); *H01M 10/482* (2013.01); *H02J 7/0022* (2013.01); *H02J 7/0026* (2013.01); *H01M 2220/20* (2013.01); *Y02E 60/122* (2013.01); *Y02T 10/7011* (2013.01); *Y02T 10/7055* (2013.01)

(58) Field of Classification Search
USPC .......................................................... 702/63
See application file for complete search history.

(56) References Cited

U.S. PATENT DOCUMENTS

| | | | |
|---|---|---|---|
| 2006/0186859 A1* | 8/2006 | Fujikawa | G01R 31/025 320/134 |
| 2007/0090844 A1* | 4/2007 | Klang | G01R 31/3648 324/426 |
| 2009/0315520 A1* | 12/2009 | Nishiyama | G01R 19/16542 320/134 |
| 2010/0201321 A1* | 8/2010 | Asakura | G01R 31/025 320/132 |
| 2011/0012604 A1* | 1/2011 | Tsujiko | H01M 10/48 324/427 |

* cited by examiner

METHODOLOGY FOR CHARGING BATTERIES SAFELY

CROSS REFERENCE TO RELATED APPLICATIONS

The present U.S. Utility patent application claims priority pursuant to 35 U.S.C. § 120 as a continuation of U.S. Utility application Ser. No. 14/499,757, entitled "METHODOLOGY FOR CHARGING BATTERIES SAFELY", filed Sep. 29, 2014, issuing as U.S. Pat. No. 9,506,990 on Nov. 29, 2016, which is a divisional of U.S. Utility application Ser. No. 12/970,838, entitled "METHODOLOGY FOR CHARGING BATTERIES SAFELY", filed Dec. 16, 2010, now U.S. Pat. No. 8,866,444, issued on Oct. 21, 2014, which claims priority pursuant to 35 U.S.C. § 119(e) to U.S. Provisional Application No. 61/352,659, entitled "METHODOLOGY FOR CHARGING BATTERIES SAFELY", filed Jun. 8, 2010, all of which are hereby incorporated herein by reference in their entirety and made part of the present U.S. Utility patent application for all purposes.

BACKGROUND OF THE INVENTION

The present invention relates generally to batteries and battery packs and, more particularly, to a method of identifying the presence of an internal short within a cell of a battery or battery pack.

Internal-cell shorts may reduce the performance capability of, or cause hazardous conditions for, a battery pack. These shorts may be caused by manufacturing/design defects (e.g., metal-particle contamination that punctures the separator creating a path for electrons between the two electrodes or extends around an edge of the separator), poor cell design (e.g., a configuration permitting edges of the electrodes to touch, or metal contamination in the active material that dissolves and plates to form a bridge between the electrodes), or electrochemical abuse. Shorts caused by manufacturing defects have resulted in the recall of many lithium-ion batteries and have motivated significant improvements in manufacturing-quality control (e.g., implementation of clean manufacturing conditions, magnets to capture metal contamination, and the like.). Through these improvements, the failure rate of lithium-ion batteries to thermal events caused by internal shorts in consumer applications has decreased to ~1-5 ppm for the large-volume manufacturers. Internal-cell shorts may also be caused by battery aging (e.g., active material dissolution and plating). Because of the small, though finite possibility that an internal-cell short may form in one or more cells during the life of a battery pack, which may lead to performance degradation or hazardous operating conditions (e.g., excessive heat generation, over-discharge, and the like.), it is important to identify the presence of cell shorts, particularly a presence of cell shorts during charging.

Typical battery cell packs used in electric vehicles (EVs) employ a multitude (e.g., thousands) of individual battery cells organized in sub-units (sometimes referred to as modules or bricks) that are interconnected. The cells and modules are combined variously in series and parallel to provide sustained high-energy storage and output as desired for any particular application.

Obtaining and evaluating specific and accurate information regarding an individual cell in this environment can be difficult. Data is evaluated individually and at a specific level but also takes into account macroscopic and gross level conditions of the application and battery pack to provide some context for the specific detailed information.

Accordingly, what is needed is an apparatus and method for identifying the presence of a short circuit in a battery pack.

BRIEF SUMMARY OF THE INVENTION

Disclosed is an apparatus and method for identifying a presence of a short circuit in a collection of interconnected battery cells, the collection including one or more cells used in one or more battery packs. Preferably the collection includes a lithium-ion cell chemistry, or the like, and the collection used in electric-vehicle-battery packs. A fault-detection apparatus for a charging system that charges a collection of interconnected battery cells, the safety system includes a data-acquisition system for receiving a set of data parameters from the collection while the charging system is actively charging the collection; a monitoring system evaluating the set of data parameters to identify a set of anomalous conditions; and a controller comparing the set of anomalous conditions against a set of predetermined profiles indicative of an internal short in one or more cells of the collection, the controller establishing an internal-short state for the collection when the comparing has a predetermined relationship to the set of predetermined profiles.

A fault-detection method for a charging system that charges a collection of interconnected battery cells, the method including a) receiving a set of data parameters from the collection while the charging system is actively charging the collection; b) evaluating the set of data parameters to identify a set of anomalous conditions; c) comparing the set of anomalous conditions against a set of predetermined profiles indicative of an internal short in one or more cells of the collection; and d) establishing an internal-short state for the collection when the comparing step identifies a predetermined relationship of the set of data parameters to the set of predetermined profiles.

The present invention provides several different systems and methods that may be used to identify when a cell is behaving abnormally and may have an internal-cell short. A further understanding of the nature and advantages of the present invention may be realized by reference to the remaining portions of the specification and the drawings.

DETAILED DESCRIPTION OF THE INVENTION

Embodiments of the present invention provide an apparatus and method for identifying a presence of a short circuit in a battery pack. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In the following text, the terms "energy-storage system," "energy-storage assembly," "battery," "cell," "brick," "battery cell," "battery-cell pack," "pack," "electrolytic-double-layer capacitor," and "ultracapacitor" may be used interchangeably (unless the context indicates otherwise) and may refer to any of a variety of different rechargeable configurations and cell chemistries described herein including, but not limited to, lithium ion (e.g., containing a lithium metal oxide cathode and a graphite anode and the like), lithium-ion polymer, nickel-metal hydride, nickel cadmium, nickel hydrogen, nickel zinc, silver zinc, or other chargeable high energy storage type/configuration. A context for one implementation is use of rechargeable Li-ion battery packs designed for plug-in electric vehicles (PHEV, HEY, and EV and the like), though other industrial applications for such high-energy battery packs may implement variations to the invention described herein without departing from the present invention.

Figure 1:
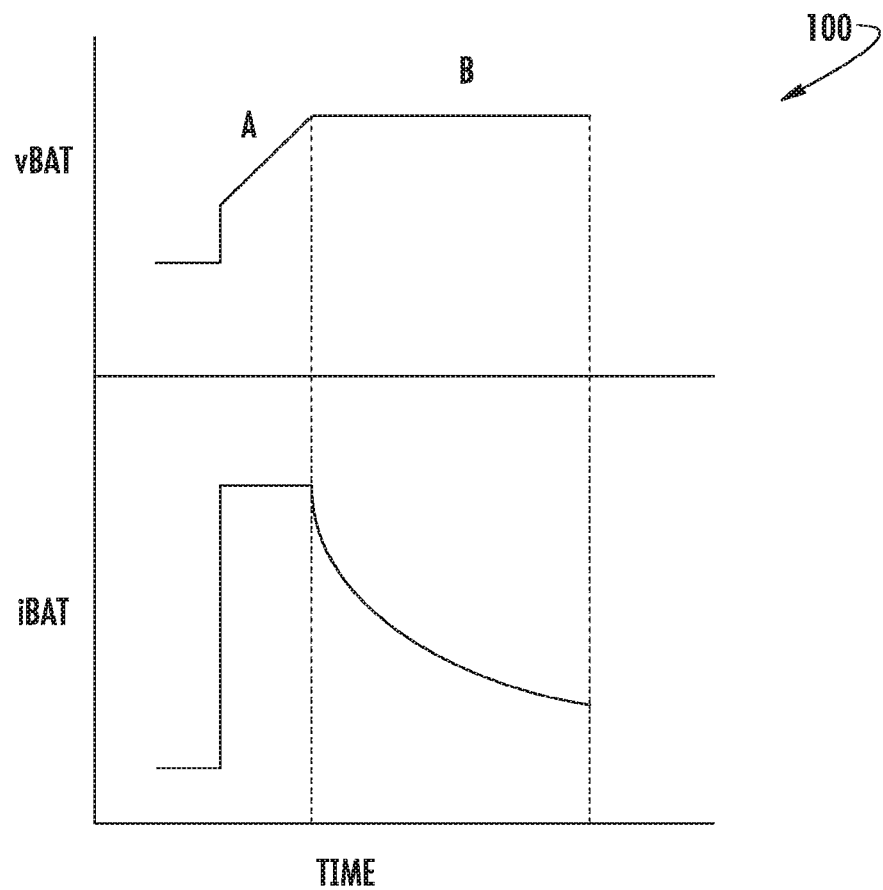
FIG. 1 is a chart of a simplified multistage (4 stage) fast charge profile for a battery charger.
Figure 2:
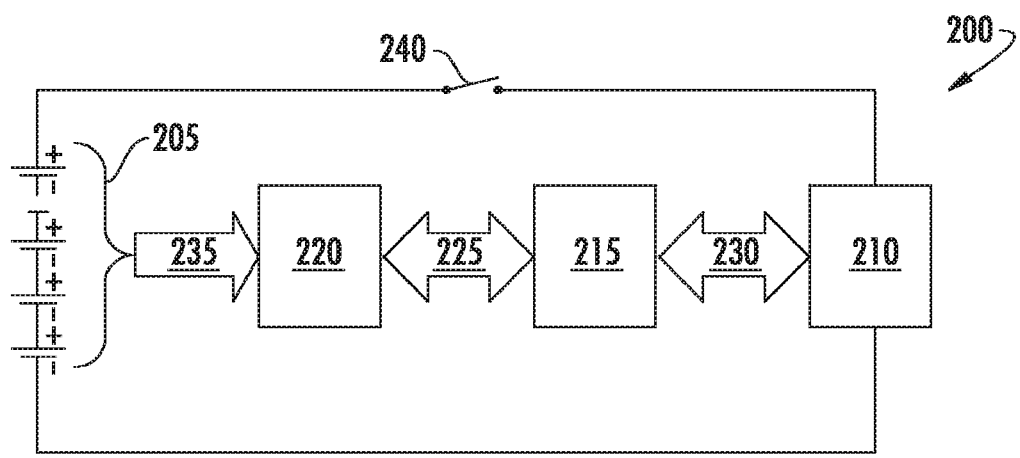
FIG. 2 is a representative charging system.

FIG. 1 and FIG. 2 provide an exemplary implementation to provide one of many different contexts for the present invention to aid in understanding. FIG. 1 is a chart of a possible charge profile 100 for a battery charger applicable to various battery chemistries, most preferably to a battery including lithium ion/polymer cell chemistry and the like. The preferred embodiment for charge profile 100 includes a first stage "A," typically followed by one or more other stages, shown collectively as "B" in FIG. 1. The various stages may include a constant current (CC) stage, a constant voltage (CV) stage; a constant power (CP) stage, combinations of these, and the like.

A representative basic charge algorithm, though the invention is not so limited, includes charge at constant current (e.g., 0.2 C to 0.7 C depending on manufacturer, where C represents the current required to reach 100% capacity in one hour) until the battery reaches a desired VPC (volts per cell), for example 4.2 VPC, and hold the voltage at 4.2 volts until the charge current has dropped to a predetermined portion (for example −10%) of the initial charge rate. The termination condition is the drop in charge current to a predetermined level. The top charging voltage, the termination current, number and type of charging stages, varies with the manufacturer. Embodiments of the present invention are generally applicable to any type of charge.

FIG. 2 is a representative embodiment for a charging system 200, such as may be used in an electric vehicle and implement the present invention. The present invention is not limited to the specifics of the implementation of the charging system or the nature of the application. System 200 includes a battery 205, a charger 210 coupled to battery 205 and a battery management system (BMS) 215 and a battery data acquisition and monitoring subsystem 220. A communication bus 225 couples subsystem 220 to BMS 215 and a communication bus 230 couples BMS 215 to charger 210. A communication bus 235 couples battery data from battery 205 to subsystem 220.

Battery 205 is shown as a series-connected group of battery cells, however the arrangement of cells may be a combination of parallel/series connected cells of many different arrangements. Charger 210 of the preferred embodiment provides the charging current applied to battery 205. BMS 215 controls the charging current according to a profile established by the embodiments of the present invention. Subsystem 220 acquires the desired data as described herein regarding battery 205. For example, the data may include voltage, SOC, temperature, and other applicable data used by BMS 215. In some embodiments, subsystem 220 may be part of BMS 215 and BMS 215 may be part of charger 210. One or more of charger 210, BMS 215, and subsystem 220 control a switch 240.

In actual practice, combinations of constant-current (CC), constant-power (CP), and constant-voltage (CV) steps/phases are often used, though there are other charging profiles that could be used. Some of the disclosed apparatus and methods are dependent upon use of one or more of these charging steps, or phases, while other apparatus and methods are generically applicable to a wider range of charging profiles. Other, less standard, charging profiles may be adapted using the present invention to detect potential fault conditions with the specifics of those implementations, without departing from the spirit and scope of the present invention.

During charging, the cell and brick voltage is expected to always increase, assuming an unchanging charge current, negligible load on the battery, and taking into account expected variations in cell impedance due to temperature and state-of-charge (SOC). When all of these conditions are met, the change in cell and block voltage over time should always be greater than or equal to zero. A decrease in voltage may indicate a decrease in the internal resistance of the cell and/or self-discharge. Similarly, during a constant voltage (CV) portion of charge, an increase in current would indicate a decrease in the internal resistance of the cell and/or self-discharge. Self-discharge of the cell above a certain rate (determined through testing a large population of cells without internal shorts) indicates that an internal-cell short is present.

Table I, below, summarizes several different methods that may be used to identify when a cell is behaving abnormally and may have an internal-cell short. Correspondingly, the battery-management system is able to measure many different properties, a set of data properties, to identify the presence of such a short.

TABLE I

Methods and Measurements for Determining the Presence of an Internal Short in a Battery Pack.

| # | Data Properties Set | Anomalous Behavior Indicating Possible Internal-Cell Short |
|---|---|---|
| 1 | Decreasing voltage during charge (CC, CV, or CP charging) | A decreasing voltage ($dV/dt < 0$ or $dV/dQ < 0$ where Q is charge capacity) with charging current active ($I_{charge}$ = true) and charging current not decreasing in the case of CC or CP. This method could also measure an abnormally high $dV/dQ$ |

TABLE I-continued

Methods and Measurements for Determining the Presence of an Internal Short in a Battery Pack.

Figure 3:
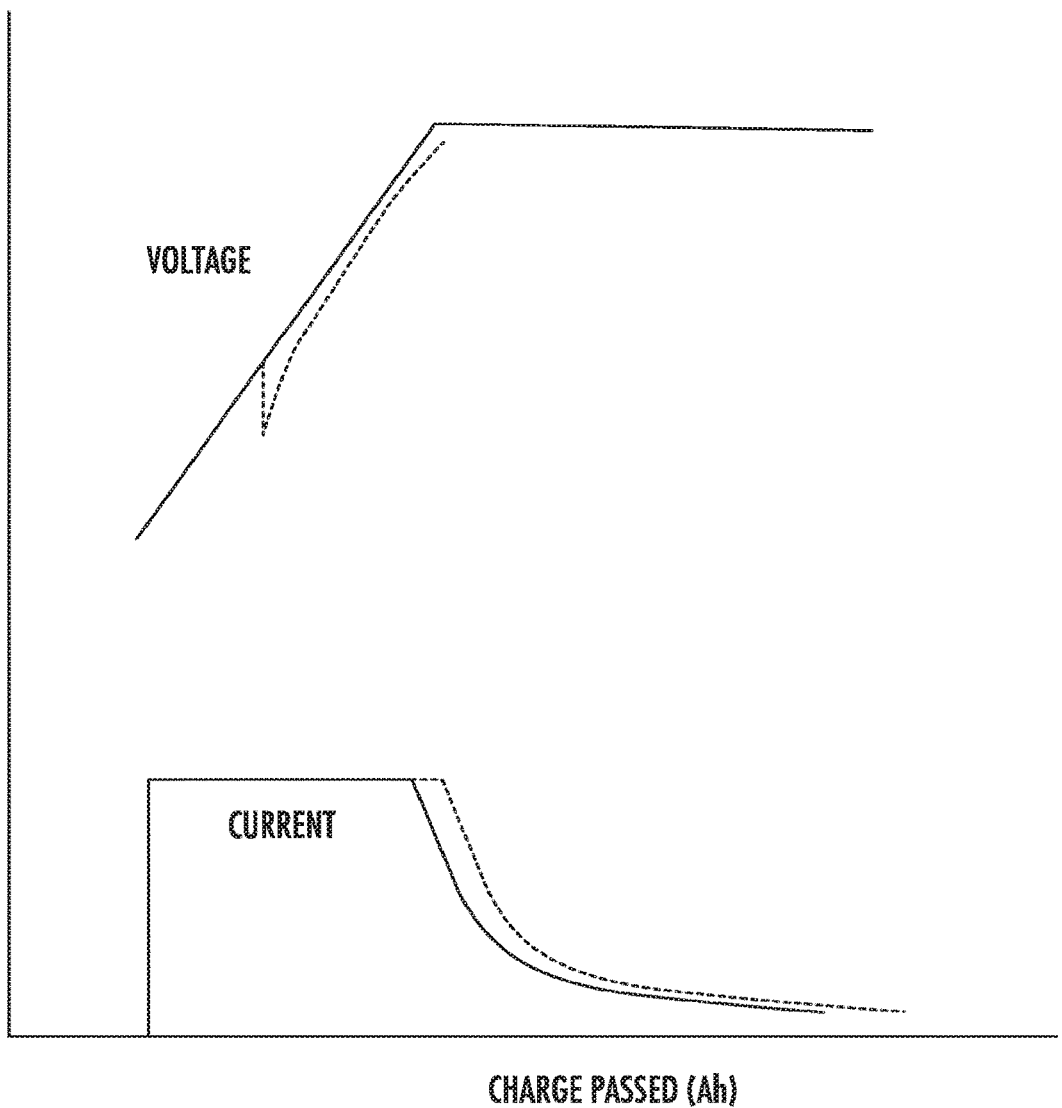
FIG. 3 is a chart of a first set of anomalous charge behavior responsive to an internal short.

| # | Data Properties Set | Anomalous Behavior Indicating Possible Internal-Cell Short |
|---|---|---|
|  |  | when the short is no longer active and the cell returns to its original voltage curve (e.g., see FIG. 3). Note that with respect to decreasing voltage, this method monitors for false trips due, for example, to (i) step change from one CC level or CP level to another, (ii) reduction in charge rate due to grid power or charger power limits in the presence of an HV AC load for example, (iii) external heating of the battery causing a reduction in impedance, or (iv) reduction in impedance at a rate which causes the loaded voltage to fall more quickly than the OCV rises. |
| 2 | Increasing current to the battery during the CV portion of charge | An increase in charging current over time ($dI/dt > 0$ or $dI/dQ > 0$). Note that this method monitors for false trips in the case that the HV AC turns on at the beginning of CV and then turns off There may be other similar items that would need to be masked. |
| 3 | Abnormally large ratio of CV to CC or CV to CP charge time | $CV_{time}/CC_{time} > (CVICC)_{max}$ or $CV_{time}/CP_{time} > (CVICP)_{max}$ (where the max value is determined through testing and contained in a look-up table). This method makes use of an extensive look-up table for charge from partial state-of charge. This method takes into account shallow and full charges as well as SOC inaccuracy as well as temperature. |
| 4 | Abnormally long charge time for specified charge rate | $t_{charge} > t_{maxcharge}$ (where the max value is determined through testing and contained in a look-up table) This method takes into account that charge power availability to the battery is not necessarily constant |
| 5 | Enhanced rate of self-discharge | Self-discharge rate (average watts based on change in SOC over time when not charging or driving) $> (SDR)_{max}$, or Bleed Ah $> (Bleed\ Ah)_{max}$, or Bleed frequency or cumulative bleed Ah of one brick $<<$ other bricks which indicates it is self discharging faster on its own and does not need to be bled (where the max value is determined through testing and contained in a look-up table) ("Bleeding" is the process of balancing bricks to one another by discharging bricks with higher voltage.) |
| 6 | Low charge efficiency (ratio of discharge to charge capacity, Ah/Ah) | Charge efficiency $< (CE)_{min}$ (where the min value is determined through testing and contained in a look-up table). This method uses an extensive look-up table for charge from partial state of charge, variable temperature, and the like. |
| 7 | Charge Ah compared to expected charge Ah | Charge Ah I [(Charge Start SOC − Charge End SOC)* Ah] > 1.X This method detects if more charge is passed than is theoretically possible from the initial SOC. |
| 8 | SOC and temperature compensated impedance drop. A real time impedance measurement ($R_i$) is made by the battery firmware during charge. An impedance measurement will be made that is below the threshold for unhealthy cells with active internal shorts. | Measured Brick impedance ((CCV − OCV (for specific SOC) I charge current) $<<$ look up table based on SOC and temperature or Change in measured Brick impedance ((CCV − OCV (for specific SOV) I charge current) reduces faster than max rate (based on normal rates of change of temperature and SOC |
| 9 | Temperature of cell, brick, or cooling medium is greater than threshold value. | Measure temperature increase for a cell in a parallel brick of cells, temperature increase in the effluent of the cooling medium above T max Measure the temperature difference between the inlet and outlet of the cooling medium. Normal (no internal short) charge will result in a predictable difference between the inlet and outlet temperature. An internal short during charge will result in a differential that is greater than prediction. An algorithm can be developed that predicts the differential based on charge rate, initial SOC at charge, initial ESS temp, ambient temperature and charge time. |

Each of the above methods represents a different way to detect a potential internal-cell short by evaluating data derived from the battery pack for anomalous conditions, including an anomalous change in cell impedance over time, an anomalous increase in total charge passed, or an anomalous change in temperature, all of which may be indicative of internal-cell shorts in the proper context. Pack electronics may be engineered to monitor necessary parameters, for example, brick impedance, for anomalies. This monitoring, depending upon implementation, preferably includes frequent/continuous acquisition/measurement/evaluation of the relevant data set. Some of the conditions are subtle and appropriate evaluation of the particular context (e.g., driving, charging, parking, and the like) is important in determining the proper conclusion to be drawn from the data.

In an exemplary embodiment, when any of the conditions noted in Table I are true, an internal-short flag state is set indicative of a potential unsafe condition. This is not to say that a particular application requires all methods to be implemented or that an application may not have additional or different methods employed. It may be the case that a single methodology is sufficient for the particular application.

Depending upon a particular implementation, there may be different responses to the setting of this flag state. For example, charging can be terminated (with further charging inhibited) and a self-discharge test can be run automatically as a diagnostic. The operator of the vehicle could be notified that they will be unable to recharge the vehicle until it is brought to a service station for evaluation. At that point, the results from the self-discharge test could be evaluated and a simple charge/discharge test run to determine whether the pack is in a potentially unsafe operating condition.

Figure 4:
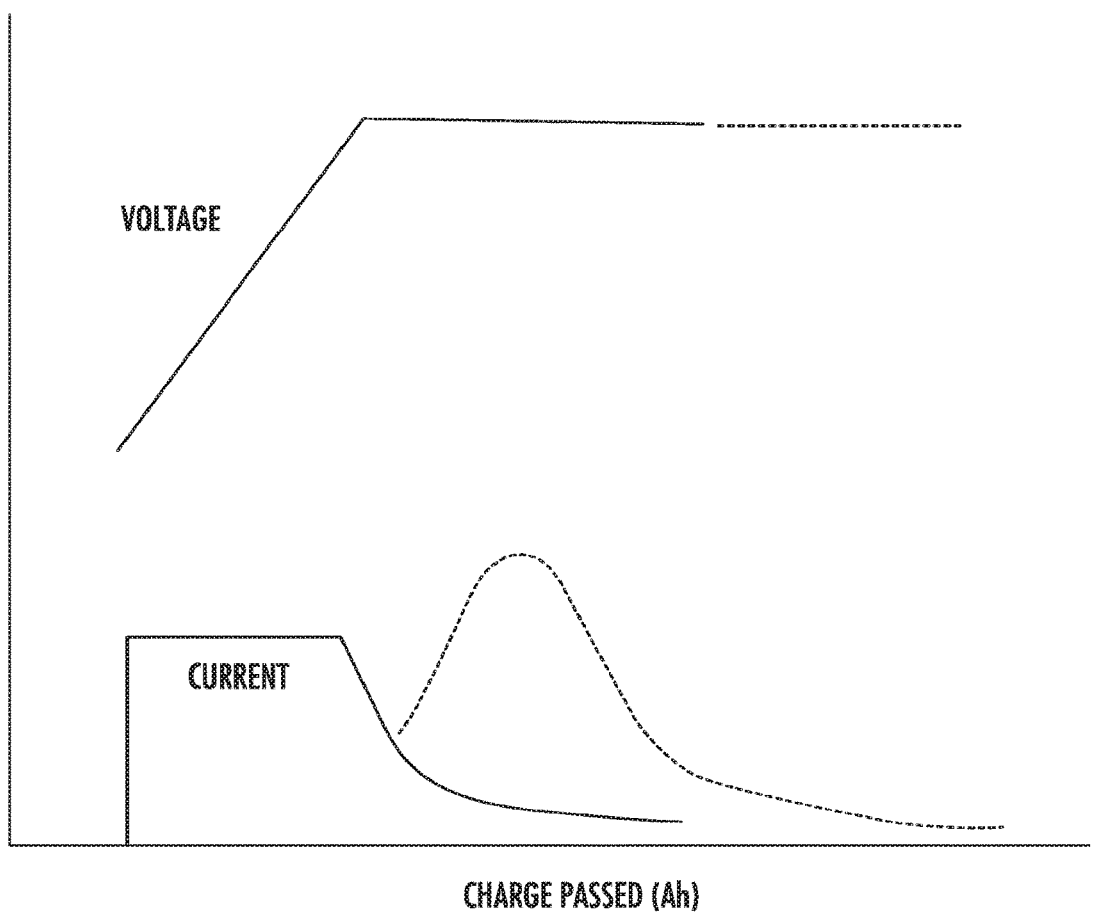
FIG. 4 is a chart of a second set of anomalous charge behavior responsive to an internal short.
Figure 5:
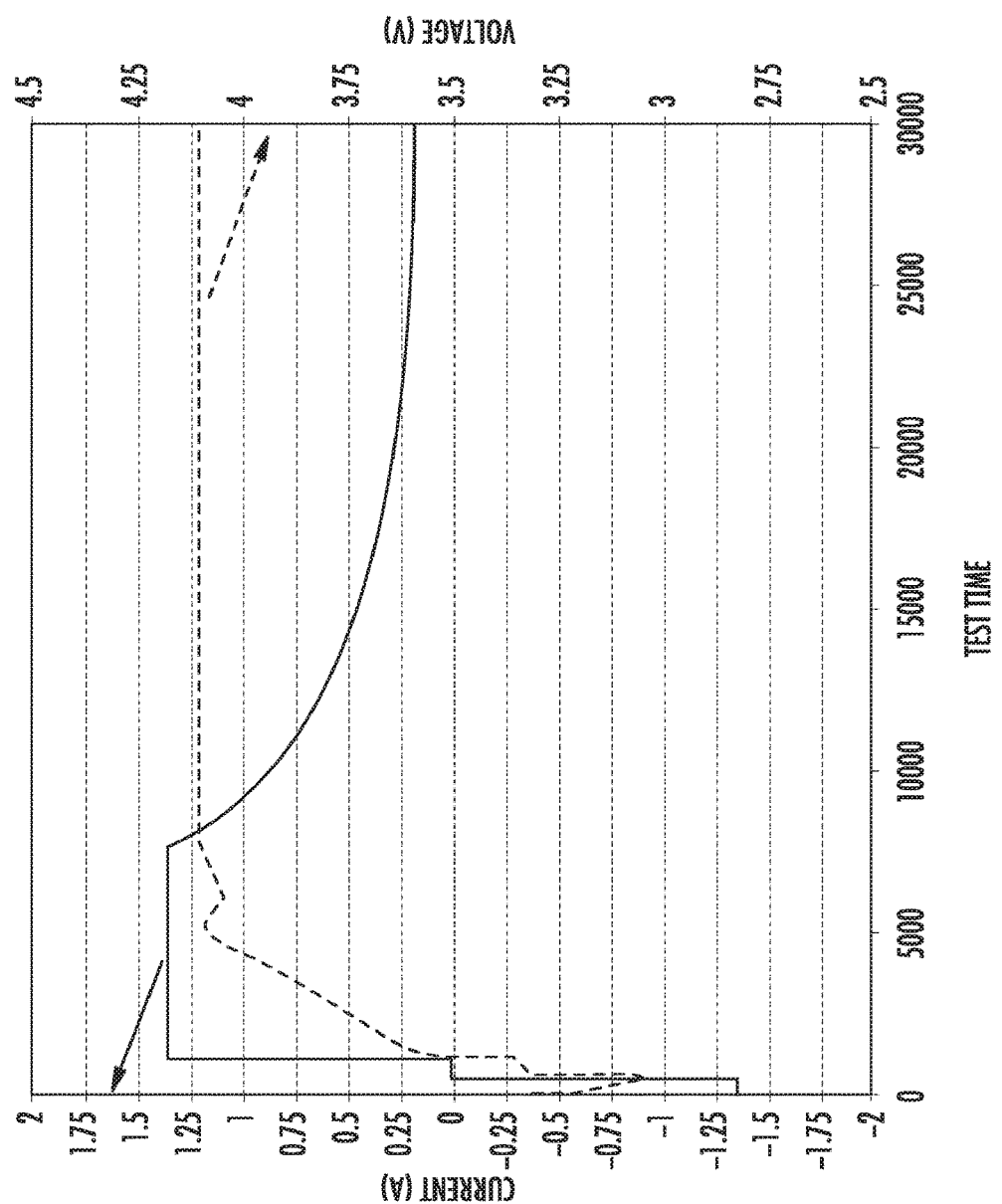
FIG. 5 is a chart of a third set of anomalous charge behavior responsive to an internal short.
Figure 6:
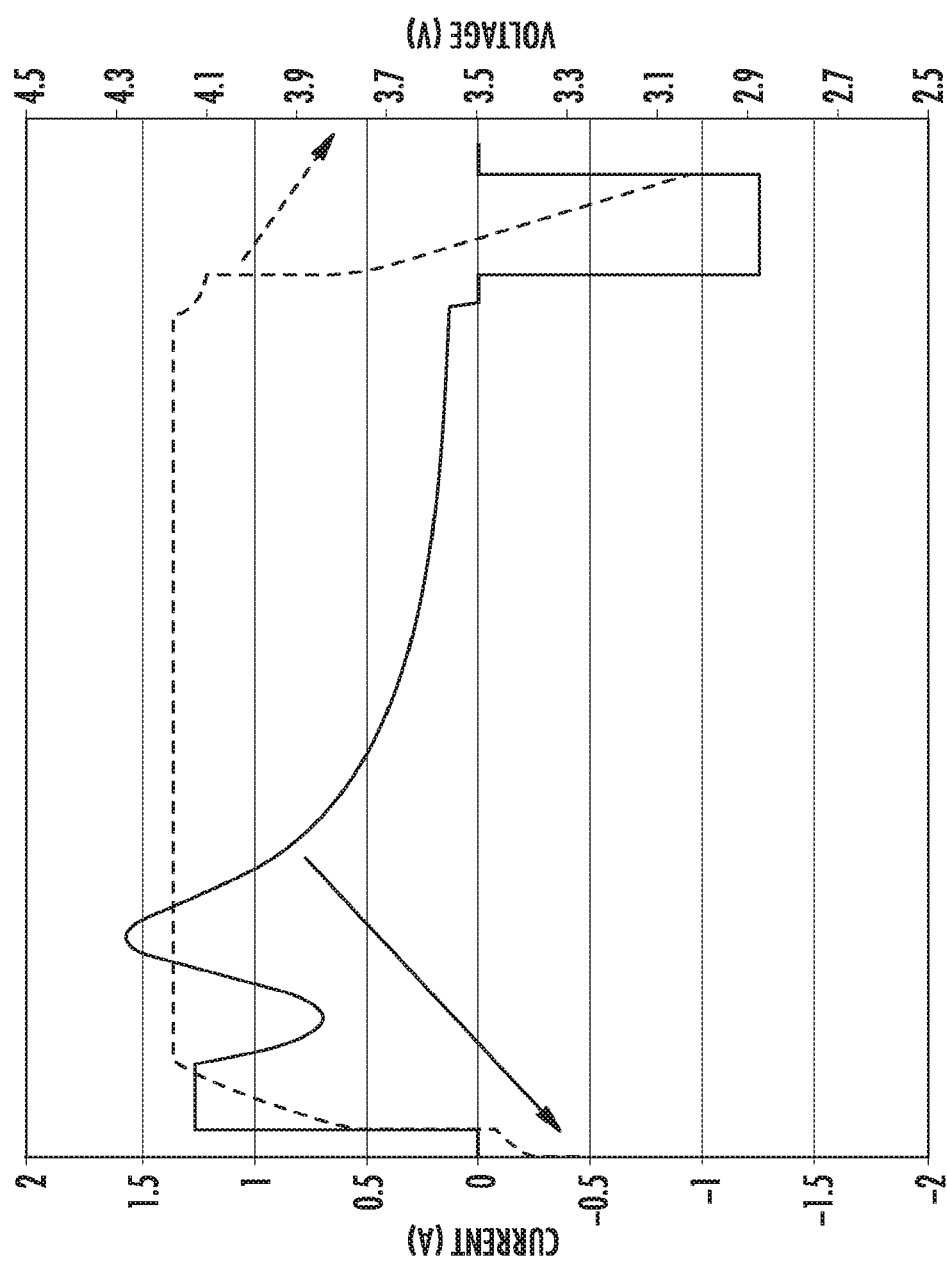
FIG. 6 is a chart of a fourth set of anomalous charge behavior responsive to an internal short.
Figure 7:
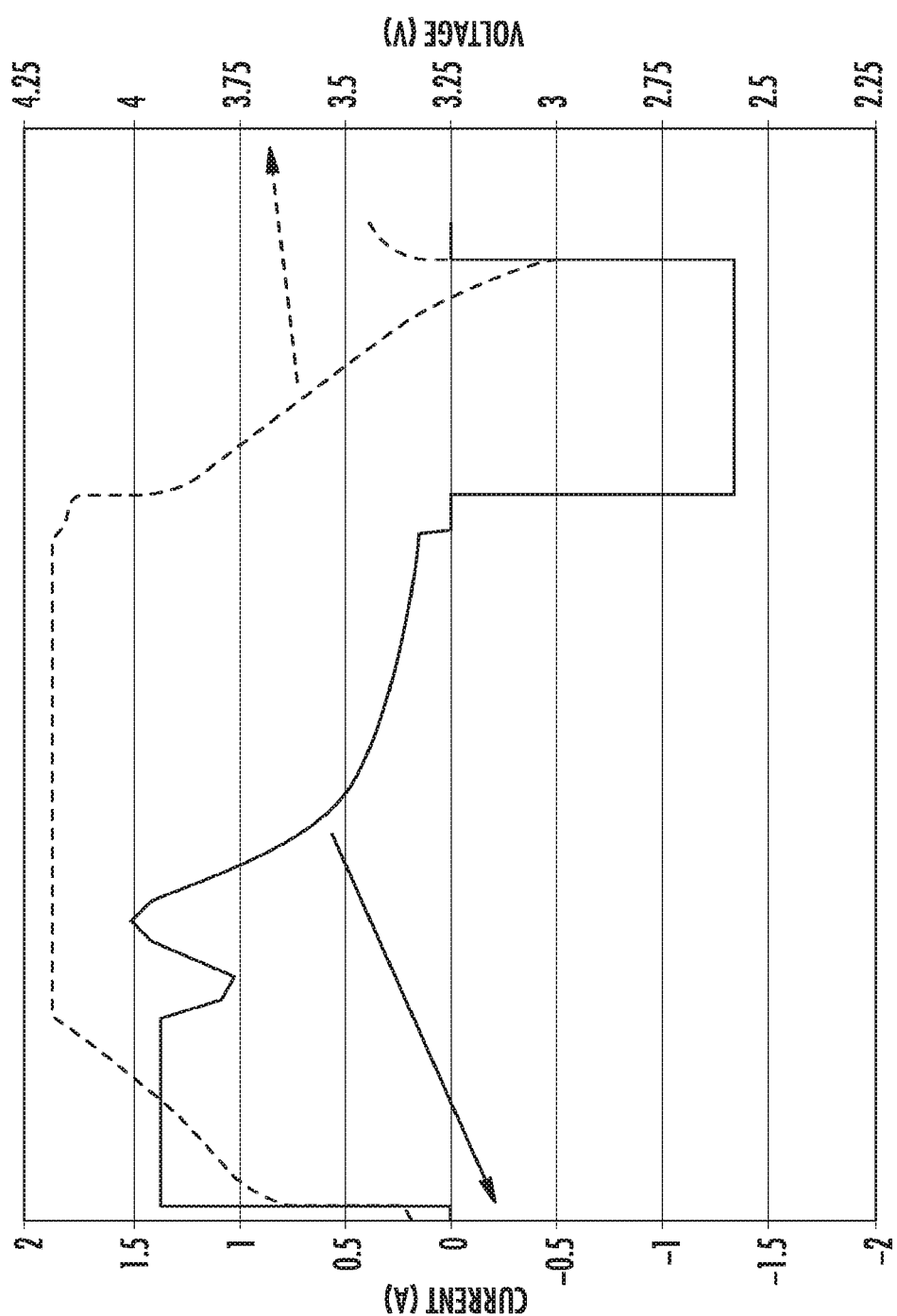
FIG. 7 is a chart of a fifth set of anomalous charge behavior responsive to an internal short.
Figure 8:
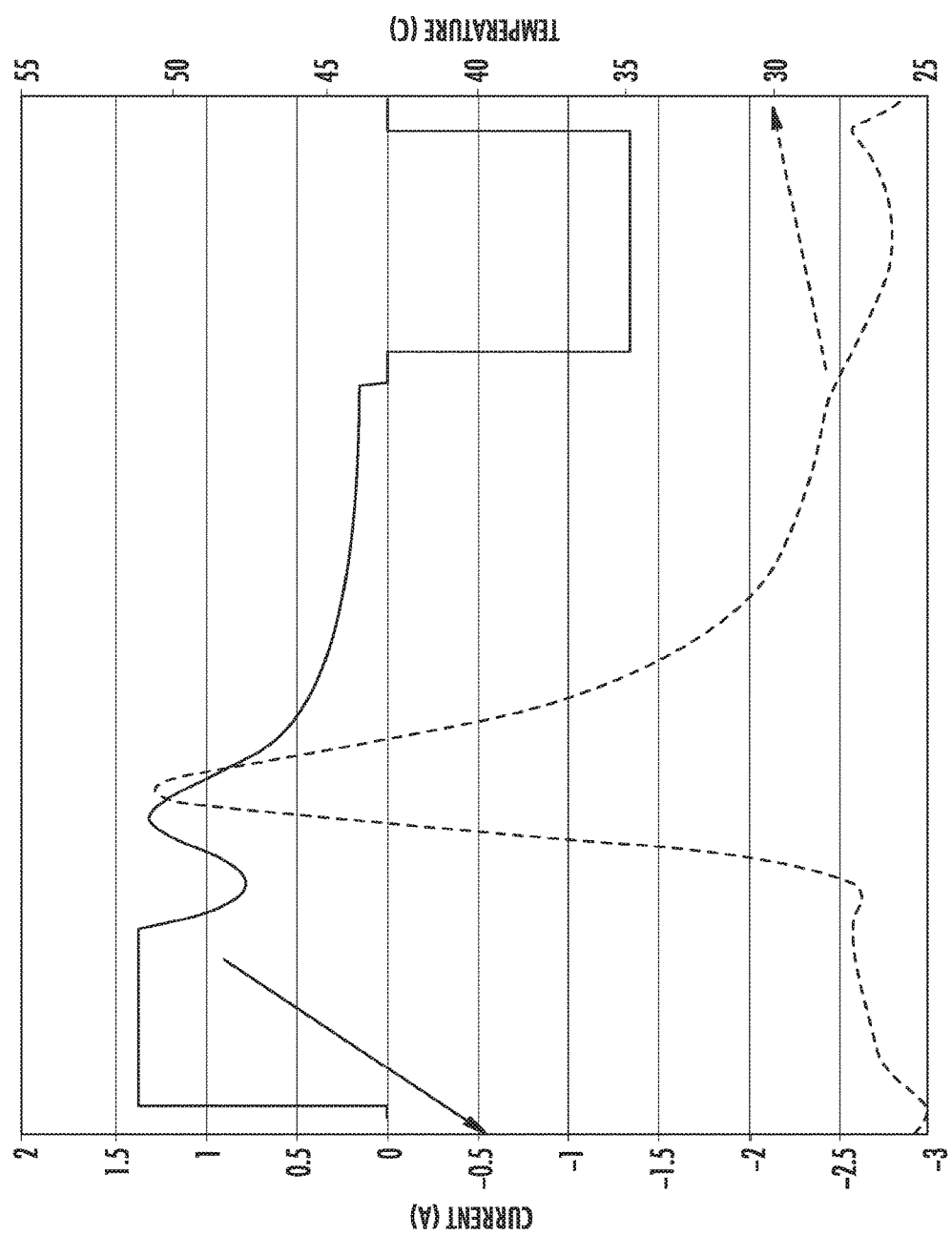
FIG. 8 is a chart of a sixth set of anomalous charge behavior responsive to an internal short.
Figure 9:
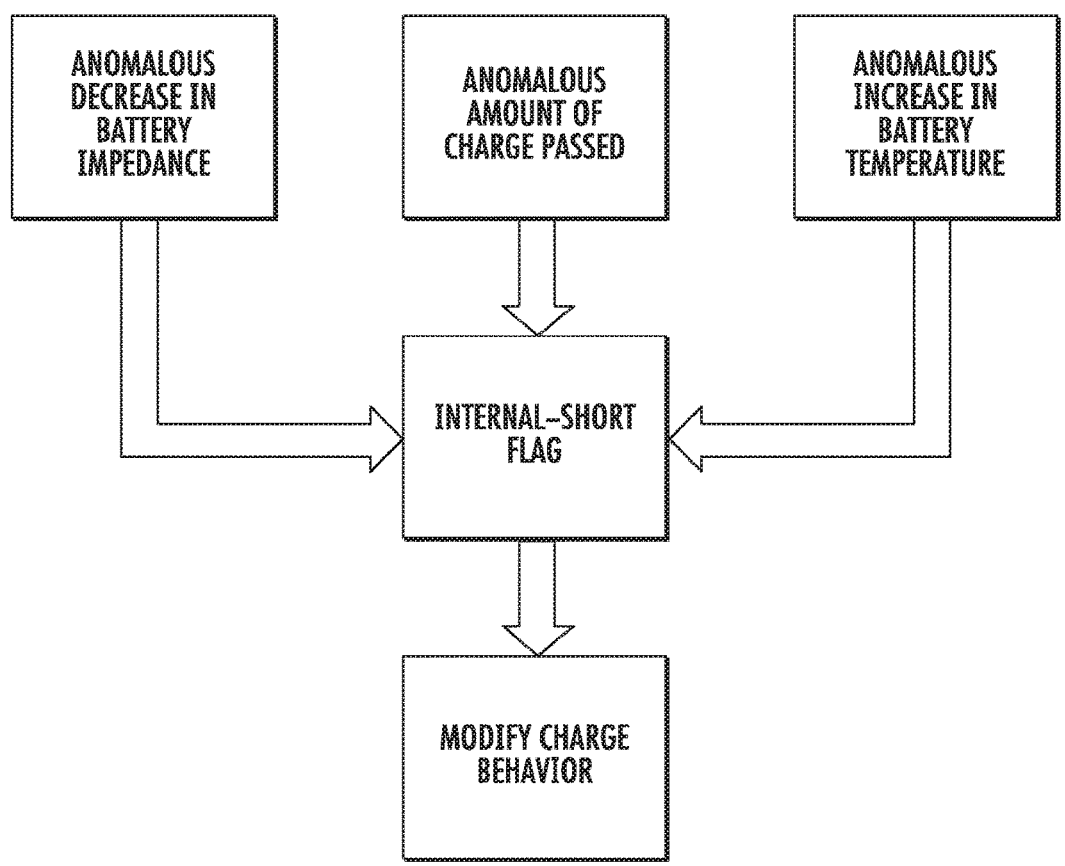
FIG. 9 is a general flowchart of an internal-short detection process according to an embodiment of the present invention.

Additional features and characteristics of the disclosed methods are seen from a review of the following figures: FIG. 3 through FIG. 9. FIG. 3 provides an example of decreasing voltage during the constant-current or constant-power portion of charge (solid lines depict normal charge conditions; dashed lines indicate a representative occurrence if an internal short formed at that point during charge-because some charge is dissipated through an internal short, the charge will be extended). FIG. 4 provides an example of an increasing current during CV portion of charge and an increase in total charge current passed (solid lines depict typical charge behavior—increasing voltage during the constant-current portion of charge and constant voltage with decreasing current during the constant-voltage portion of charge; dashed lines depict an anomaly in the charge behavior caused by an internal-cell short. The total charge current passed increases as some of the current is dissipated through the internal short). FIG. 5 provides test results from a battery showing a decrease in voltage during a CC portion of charge where the current to the battery is unchanging (note that in the case that the current drops a bit during CP or CC due to some other component taking power from the charger, a drop would be expected). FIG. 6 provides test results from a battery showing an increase in current during the CV portion of charge. FIG. 7 provides test results from a battery showing an increase in current during the CV portion of charge. FIG. 8 provides test results from a battery showing an increase in current during the CV portion of charge with a coincident increase in the battery temperature (temperature spikes due to internal-cell shorts are undesirable and may lead to hazardous conditions). FIG. 9 is a general flowchart of an internal-short detection process according to an embodiment of the present invention. In FIG. 3 through FIG. 8, the profiles and magnitudes of the values are representative and actual data parameters in an operating system will vary from those shown and the thresholds/conditions indicative of the described methods are appropriately adapted for the particularities of each application and implementation.

In FIG. 9, a preferred process of the present invention detects anomalous conditions possibly associated with an internal-short in one or more cells of battery (as shown, for example, anomalous conditions associated with impedance, passed charge, and cell/battery temperature), evaluating the conditions to establish that an internal-short does, or is likely to exist (probability exceeding some predetermined threshold for example) to set an internal-short flag. In some embodiments, that will be the extent of the process as some other system or process will respond to the setting of the internal-short flag. In the preferred embodiment, charge behavior is modified responsive to the setting of the internal-short flag. For example, modifying charge behavior includes many different types of operation, from suspending/inhibiting charging, limiting charging in some fashion (e.g., charging to an SOC less than 100% or use slower charge rate and the like), initiating stricter temperature limits/checks inside the cell, and the like.

Methods 1 and 2 above (i.e., decreasing voltage during charge and increasing current during CV charge) can be measured during any charge cycle that begins with $V<V_{max}$ and $deltaT<(deltaT)_{max}$, where deltaT is the maximum difference in temperature between the cells throughout the battery pack and the ambient temperature and $(deltaT)_{max}$ is the maximum acceptable difference in temperature that would affect a change in voltage or current during charging, this value being determined through testing and contained in a look-up table. The battery-management system verifies that the charge current has not decreased or been interrupted, and that no additional loads have been introduced (i.e., HVAC) before indicating a hazardous condition.

Methods 3 through 7 use time or capacity measurement. For methods 3 and 4, a time counter can be used to determine if the battery has been charging longer than the time indicated in a look-up table for a pack of that capacity and state of charge. This look-up table may be compiled from pack data, as well as from resistance measurements and cycling data from cells at end-of life. These measurements also require that $deltaT<(deltaT)_{max}$. For method 5, the self-discharge rate of the pack can be measured and compared with the self-discharge rate for a cell of that capacity without an internal-cell short present (from a look-up table). This can be measured using voltage measurements over time, or, if a bleed circuit is present, it can be measured by determining the amount of Ah passed through the bleed circuit to balance the series blocks of cells. These methods take into consideration shallow and full charges, as well as SOC inaccuracy.

Method 6 (charge efficiency) is similar to method 5 in that it measures the amount of self-discharge. This method also requires that any temperature, rate, and cutoff voltage differences between charge and discharge are accounted for. If an internal-cell short is present, the charge capacity will increase (some current is going through the short) and if the short is maintained the discharge capacity will decrease relative to a cell without a short. The ratio of the discharge to the charge capacity should be 1 for a fully reversible cell without shorts or side reactions. This value is typically ~99.97 or higher for new cells without shorts. For a cell with an internal short, this value may be ~70% or lower. A low-end limit value is determined through testing for the cell in use and this value will be included in a look-up table for the battery management system.

Method 7 may be the most simple to implement for some applications, especially in a large battery pack such as the type of pack that might be used in an electric vehicle. This method measures the total charge passed to the pack, module, or parallel brick. If the total charge passed exceeds the expected charge capacity from the initial to final state of charge (SOC), then the additional charge may have been dissipated through internal shorts. In a vehicle battery, the capacity is continuously monitored in order to estimate remaining range. The calculated Ah capacity (CAC) is monitored as the pack ages, enabling this method to be used throughout the life of the battery pack. Say for example that a 100 Ah battery pack is assembled and it is at 20% SOC initially, or 20 Ah of energy is available in the pack. This example pack contains cells with internal shorts and takes 130 Ah (an additional 110 Ah) to reach full pack voltage. This means that 30 Ah were dissipated through internal cell shorts and caused the pack to heat up, potentially creating a hazardous condition. By comparing the total charge passed to the expected value, this method may be used to interrupt charge, potentially before a hazardous condition can occur. Method 7 is doubly useful in that it can also be used as another layer of protection against pack overcharge, a highly hazardous condition should it occur.

Method 8 involves a real-time measurement of the impedance of parallel bricks of cells, and potentially also series strings of cells. This measurement is continuously made during pack operation to estimate available power using a combination of voltage and current measurements. During charge, these measurements are typically not made. However, some embodiments of this invention propose use of a continuous estimation of battery impedance to detect an internal short. For a given SOC, the expected impedance can be kept in a look-up table. If the impedance at that SOC is lower than the threshold value, it may indicate that an internal cell short has formed. This would capture the case of a decreasing voltage during CC or CP charge as well as an increase in current during CV charge. As indicated above, any additional load on the battery pack or change in temperature is properly accounted for.

Method 9 involves the direct measurement of a resultant increase in temperature due to an internal-cell short. The cell, brick, and coolant temperature (refrigerant, water, air or another working fluid) is monitored continuously. If it increases in temperature more rapidly and/or to a higher value than is expected for that charge condition, a hazardous condition is indicated and the charge is interrupted.

Due to the higher number of cells that are used in parallel in a high-energy pack such as those used in an electric vehicle, sensitive battery electronics are necessary in order to detect a decrease in voltage on charge, an increase in current on CV charge, an enhanced self-discharge rate, the temperature distribution throughout the battery pack, the charge time, and accurate charge and discharge capacity. These battery electronics are quite sophisticated and require a finite current draw. This current draw is accounted for in choosing the limits for the look-up table.

To avoid an imbalance in the voltage of blocks of cells in series, a bleed circuit may be used to match block voltages. This bleed circuit can be used to identify a block of cells with an enhanced rate of self-discharge (bleed Ah or frequency of bleeding).

Using method 7 requires some sensitivity in measuring the charge capacity to a brick. Cells with a current bump might have an increase in charge capacity of more than a factor of 2 (half of the total charge Ah passed are dissipated through an internal short, creating heat). For a parallel brick with 22 cells, this means that the pack electronics pick-up on an increase of brick capacity. Table II summarizes the required sensitivity, assuming a factor of 2 increase in charge Ah passed.

TABLE II

| Number of cells with current bump | Percent increase in charge current in brick |
| --- | --- |
| 1 | 4.55 |
| 2 | 9.09 |
| 3 | 13.64 |
| 4 | 18.18 |
| 5 | 22.73 |
| 6 | 27.27 |
| 7 | 31.82 |
| 8 | 36.36 |
| 9 | 40.91 |
| 10 | 45.45 |
| 11 | 50 |
| 12 | 54.55 |
| 13 | 59.09 |
| 14 | 63.64 |
| 15 | 68.18 |
| 16 | 72.73 |
| 17 | 77.27 |
| 18 | 81.82 |
| 19 | 86.36 |
| 20 | 90.91 |
| 21 | 95.45 |
| 22 | 100.00 |

The system above has been described in the preferred embodiment of an embedded automobile (EV) electric charging system for lithium ion and related cell chemistries. Other applications and cell chemistries are contemplated to be within the scope of the present invention, including, for example, NiMH collections. For example, NiMH cells charge until the voltage decreases (due to side reactions in the cell). In such cell chemistries, an anomalous decrease in voltage (e.g., a magnitude of the actual voltage decrease exceeding a predetermined threshold $SOC_{decrease}$ value) may indicate internal shorting.

The system, method, and computer program product described in this application may, of course, be embodied in hardware; e.g., within or coupled to a Central Processing Unit ("CPU"), microprocessor, microcontroller, System on Chip ("SOC"), or any other programmable device. Additionally, the system, method, and computer program product, may be embodied in software (e.g., computer readable code, program code, instructions and/or data disposed in any form, such as source, object or machine language) disposed, for example, in a computer usable (e.g., readable) medium configured to store the software. Such software enables the function, fabrication, modeling, simulation, description and/or testing of the apparatus and processes described herein. For example, this can be accomplished through the use of general programming languages (e.g., C, C++), GDSII databases, hardware description languages (HDL) including Verilog HDL, VHDL, AHDL (Altera HDL) and so on, or other available programs, databases, nanoprocessing, and/or circuit (i.e., schematic) capture tools. Such software can be disposed in any known computer usable medium including semiconductor (Flash, or EEPROM, ROM), magnetic disk, optical disc (e.g., CDROM, DVD-ROM, etc.) and as a computer data signal embodied in a computer usable (e.g., readable) transmission medium (e.g., carrier wave or any other medium including digital, optical, or analog-based medium). As such, the software can be transmitted over communication networks including the Internet and intranets. A system, method, computer program product, and propagated signal embodied in software may be included in a semiconductor intellectual property core (e.g., embodied in HDL) and transformed to hardware in the production of integrated circuits. Additionally, a system, method, computer program product, and propagated signal as described herein may be embodied as a combination of hardware and software.

One of the preferred implementations of the present invention is as a routine in an operating system made up of programming steps or instructions resident in a memory of a computing system as well known, during computer operations. Until required by the computer system, the program instructions may be stored in another readable medium, e.g. in a disk drive, or in a removable memory, such as an optical disk for use in a CD ROM computer input or other portable memory system for use in transferring the programming steps into an embedded memory used in the charger. Further, the program instructions may be stored in the memory of another computer prior to use in the system of the present invention and transmitted over a LAN or a WAN, such as the Internet, when required by the user of the present invention. One skilled in the art should appreciate that the processes controlling the present invention are capable of being distributed in the form of computer readable media in a variety of forms.

Any suitable programming language can be used to implement the routines of the present invention including C, C++, Java, assembly language, etc. Different programming techniques can be employed such as procedural or object oriented. The routines can execute on a single processing device or multiple processors. Although the steps, operations or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, and the like. The routines can operate in an operating system environment or as stand-alone routines occupying all, or a substantial part, of the system processing.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer-readable medium" for purposes of embodiments of the present invention may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A fault-detection apparatus for a charging system that charges a collection of interconnected battery cells, the fault-detection apparatus comprising:
   at least one communication bus;
   a data-acquisition system coupled to the at least one communication bus for receiving a set of data parameters from the collection while the charging system is actively charging the collection, the set of data parameters including a change in charging voltage over time (dV/dt), wherein the set of data parameters are measured during a charge cycle that begins with deltaT<(deltaT)max, where deltaT is a difference in temperature between battery cells of the collection and an ambient temperature, and (deltaT)max is a maximum acceptable difference in temperature relating to charging;
   a monitoring system coupled to the at least one communication bus for evaluating the set of data parameters;
   a controller coupled to the at least one communication bus for determining that a short exists in the collection when dV/dt is less than zero during a constant current charging interval, the controller configured to:
      set an internal-short notification in response to determining that a short exists in the collection; and
      modify a charging behavior of the charging system in response to setting the internal-short notification.

2. The fault-detection apparatus of claim 1, wherein:
   the set of data parameters further includes a change in charging voltage versus a change in charge capacity (dV/dQ); and
   the controller further determining that a short exists in the collection when dV/dQ is less than zero during the constant current charging interval.

3. The fault-detection apparatus of claim 2, wherein the controller further determining that a short is no longer active when dV/dQ increases by a threshold.

4. The fault-detection apparatus of claim 1, wherein the set of data parameters are measured during a charge cycle that further begins when the collection of interconnected battery cells is in a partially discharged state.

5. The fault-detection apparatus of claim 1, wherein the controller verifies that a charge current has not decreased or been interrupted and that no additional load has been introduced before determining that the short exists.

6. The fault-detection apparatus of claim 1, wherein the controller further determines a false short upon one or more of:
   a step change in charging voltage from one constant current level to another constant current level;
   a step change in charging voltage from one constant power level to another constant power level;
   a reduction in charge rate due to grid power or charger power limits in the presence of a high voltage vehicle load; or
   an external heating of the collection causing a reduction in impedance of the collection.

7. A fault-detection apparatus for a charging system that charges a collection of interconnected battery cells, the fault-detection apparatus comprising:
   at least one communication bus;
   a data-acquisition system coupled to the at least one communication bus for receiving a set of data parameters from the collection while the charging system is actively charging the collection, the set of data parameters including a change in charging voltage versus a change in charge capacity (dV/dQ), wherein the set of data parameters are measured during a charge cycle that begins with deltaT<(deltaT)max, where deltaT is a difference in temperature between battery cells of the collection and an ambient temperature, and (deltaT) max is a maximum acceptable difference in temperature relating to charging;
   a monitoring system coupled to the at least one communication bus for evaluating the set of data parameters;
   a controller coupled to the at least one communication bus for determining that a short exists in the collection when dV/dQ is less than zero during a constant current charging interval, the controller configured to:
      set an internal-short notification in response to determining that a short exists in the collection; and
      modify a charging behavior of the charging system in response to setting the internal-short notification.

8. The fault-detection apparatus of claim 7, wherein the controller further determining that a short is no longer active when dV/dQ increases by a threshold.

9. The fault-detection apparatus of claim 7, wherein the set of data parameters are measured during a charge cycle that further begins when the collection of interconnected battery cells is in a partially discharged state.

10. The fault-detection apparatus of claim 7, wherein the controller verifies that a charge current has not decreased or been interrupted and that no additional load has been introduced before determining that the short exists.

11. The fault-detection apparatus of claim 7, wherein the controller further determines a false short upon one or more of:
   a step change in charging voltage from one constant current level to another constant current level;
   a step change in charging voltage from one constant power level to another constant power level;
   a reduction in charge rate due to grid power or charger power limits in the presence of a high voltage vehicle load; or
   an external heating of the collection causing a reduction in impedance of the collection.

12. A fault-detection apparatus for a charging system that charges a collection of interconnected battery cells, the fault-detection apparatus comprising:

at least one communication bus;
a data-acquisition system coupled to the at least one communication bus for receiving a set of data parameters from the collection while the charging system is actively charging the collection, the set of data parameters including change in charging current over time (dI/dt), wherein the set of data parameters are measured during a charge cycle that begins with deltaT<(deltaT)max, where deltaT is a difference in temperature between battery cells of the collection and an ambient temperature, and (deltaT)max is a maximum acceptable difference in temperature relating to charging;
a monitoring system coupled to the at least one communication bus for evaluating the set of data parameters;
a controller coupled to the at least one communication bus for determining that a short exists in the collection when dI/dt is greater than zero during a constant voltage charging interval, the controller configured to:
set an internal-short notification in response to determining that a short exists in the collection; and
modify a charging behavior of the charging system in response to setting the internal-short notification.

13. The fault-detection apparatus of claim 12, wherein:
the set of data parameters further includes a change in charging current versus change in charge capacity (dI/dQ); and
the controller further determining that a short exists in the collection when dI/dQ is greater than zero during the constant voltage charging interval.

14. The fault-detection apparatus of claim 12, wherein the set of data parameters are measured during a charge cycle that further begins when the collection of interconnected battery cells is in a partially discharged state.

15. The fault-detection apparatus of claim 12, wherein the controller verifies that a charge current has not decreased or been interrupted and that no additional load has been introduced before determining that the short exists.

16. The fault-detection apparatus of claim 12, wherein the controller further determines a false short upon one or more of:
a step change in charging voltage from one constant current level to another constant current level;
a step change in charging voltage from one constant power level to another constant power level;
a reduction in charge rate due to grid power or charger power limits in the presence of a high voltage vehicle load; or
an external heating of the collection causing a reduction in impedance of the collection.

17. A fault-detection apparatus for a charging system that charges a collection of interconnected battery cells, the fault-detection apparatus comprising:
at least one communication bus;
a data-acquisition system coupled to the at least one communication bus for receiving a set of data parameters from the collection while the charging system is actively charging the collection, the set of data parameters including change in charging current versus a change in charge capacity (dI/dQ), wherein the set of data parameters are measured during a charge cycle that begins with deltaT<(deltaT)max, where deltaT is a difference in temperature between battery cells of the collection and an ambient temperature, and (deltaT)max is a maximum acceptable difference in temperature relating to charging;
a monitoring system coupled to the at least one communication bus for evaluating the set of data parameters;
a controller coupled to the at least one communication bus for determining that a short exists in the collection when dI/dQ is greater than zero during a constant voltage charging interval, the controller configured to:
set an internal-short notification in response to determining that a short exists in the collection; and
modify a charging behavior of the charging system in response to setting the internal-short notification.

18. The fault-detection apparatus of claim 17, wherein the controller further determining that a short is no longer active when dV/dQ increases by a threshold.

19. The fault-detection apparatus of claim 17, wherein the set of data parameters are measured during a charge cycle that further begins when the collection of interconnected battery cells is in a partially discharged state.

20. The fault-detection apparatus of claim 17, wherein the controller verifies that a charge current has not decreased or been interrupted and that no additional load has been introduced before determining that the short exists.

21. The fault-detection apparatus of claim 17, wherein the controller further determines a false short upon one or more of:
a step change from one constant current level to another constant current level;
a step change from one constant power level to another constant power level;
a reduction in charge rate due to grid power or charger power limits in the presence of a high voltage vehicle load; or
an external heating of the collection causing a reduction in impedance of the collection.

* * * * *